(12) United States Patent
Sasaki

(10) Patent No.: US 10,737,461 B2
(45) Date of Patent: Aug. 11, 2020

(54) CONDUCTIVE MEMBER

(71) Applicant: Seiren Co., Ltd., Fukui-shi, Fukui (JP)

(72) Inventor: Takayuki Sasaki, Fukui (JP)

(73) Assignee: Seiren Co., Ltd., Fukui (JP)

( * ) Notice: Subject to any disclaimer, the term of this patent is extended or adjusted under 35 U.S.C. 154(b) by 131 days.

(21) Appl. No.: 15/760,152

(22) PCT Filed: Aug. 18, 2016

(86) PCT No.: PCT/JP2016/074102
§ 371 (c)(1),
(2) Date: Mar. 14, 2018

(87) PCT Pub. No.: WO2017/047320
PCT Pub. Date: Mar. 23, 2017

(65) Prior Publication Data
US 2018/0250909 A1 Sep. 6, 2018

(30) Foreign Application Priority Data

Sep. 16, 2015 (JP) .................. 2015-182825

(51) Int. Cl.
*B32B 5/02* (2006.01)
*B32B 7/02* (2019.01)
(Continued)

(52) U.S. Cl.
CPC ............... *B32B 5/024* (2013.01); *B32B 5/00* (2013.01); *B32B 5/02* (2013.01); *B32B 7/02* (2013.01);
(Continued)

(58) Field of Classification Search
CPC .. B32B 5/024; B32B 5/02; B32B 5/00; B32B 15/20; B32B 15/14; B32B 7/02; B32B 2307/202; B32B 2262/0276; C23C 18/30; C23C 18/405; C23C 18/285; C23C 18/1653; C23C 18/40; C23C 18/31;
(Continued)

(56) References Cited

U.S. PATENT DOCUMENTS

2010/0208445 A1 8/2010 Asvadi et al.
2014/0034366 A1 2/2014 Otsubo et al.

FOREIGN PATENT DOCUMENTS

CN 104737636 A 6/2015
JP H10-006418 1/1998
(Continued)

OTHER PUBLICATIONS

Machine Translation of JP 2004-011035. (Year: 2004).*
(Continued)

*Primary Examiner* — Brian Handville
(74) *Attorney, Agent, or Firm* — K&L Gates LLP; Luis C. Cullman; Georgia N. Kefallinos

(57) ABSTRACT

A conductive member includes a conductive fabric containing warp and weft as well as a support, includes at least one linear bend, and is imparted with electrical conductivity across the linear bend. In the conductive member, an angle formed between the linear bend and one of the warp and the weft is 5 to 45° C. The conductive fabric is preferably a conductive fabric obtained by layering a metal coating, formed by a wet plating method, on a fabric including a synthetic fiber.

5 Claims, 1 Drawing Sheet

(51) Int. Cl.
  *C25D 7/00* (2006.01)
  *B32B 5/00* (2006.01)
  *C23C 18/16* (2006.01)
  *C23C 18/28* (2006.01)
  *C23C 18/40* (2006.01)
  *C23C 18/30* (2006.01)
  *B32B 15/14* (2006.01)
  *B32B 15/20* (2006.01)
  *C23F 17/00* (2006.01)
  *H05K 1/03* (2006.01)
  *C25D 3/46* (2006.01)
  *C25D 3/12* (2006.01)
  *H05K 3/18* (2006.01)

(52) U.S. Cl.
  CPC .............. *B32B 15/14* (2013.01); *B32B 15/20* (2013.01); *C23C 18/1653* (2013.01); *C23C 18/285* (2013.01); *C23C 18/30* (2013.01); *C23C 18/40* (2013.01); *C23C 18/405* (2013.01); *C23F 17/00* (2013.01); *C25D 7/00* (2013.01); *H05K 1/038* (2013.01); *B32B 2262/0276* (2013.01); *B32B 2307/202* (2013.01); *C25D 3/12* (2013.01); *C25D 3/46* (2013.01); *H05K 3/181* (2013.01); *H05K 3/188* (2013.01); *H05K 2201/0145* (2013.01); *H05K 2203/072* (2013.01); *H05K 2203/0723* (2013.01)

(58) Field of Classification Search
  CPC .......... H05K 1/038; H05K 2203/0723; H05K 2203/072; H05K 2201/0145; H05K 3/188; H05K 3/181; C23F 17/00; C25D 7/00; C25D 3/46; C25D 3/12
  See application file for complete search history.

(56) References Cited

FOREIGN PATENT DOCUMENTS

| | | |
|---|---|---|
| JP | 2002-094290 A | 3/2002 |
| JP | 2004-011035 A | 1/2004 |
| JP | 2007-027221 A | 2/2007 |
| JP | 2008-081011 A | 4/2008 |
| JP | 2008-283167 A | 11/2008 |
| JP | 2009-267230 A | 11/2009 |
| JP | 2011-501787 A | 1/2011 |
| JP | 2013-021000 A | 1/2013 |
| WO | 2003/099417 A1 | 12/2003 |
| WO | 2009/050629 A1 | 4/2009 |
| WO | 2017/047320 A1 | 3/2017 |

OTHER PUBLICATIONS

Machine Translation of JP H10-006418. (Year: 1998).*

Office Action dated Jul. 23, 2019 for Japanese Patent Application No. 2015-182825 (Original and English Translation provided).

Office Action for Chinese Patent Application Serial No. 201680051400.2 dated Mar. 29, 2019. (Original in Chinese and English Translation provided).

Office Action for Korean Patent Application Serial No. 10-2018-7010310 dated May 7, 2019. (Original in Korean and English Translation Provided).

* cited by examiner

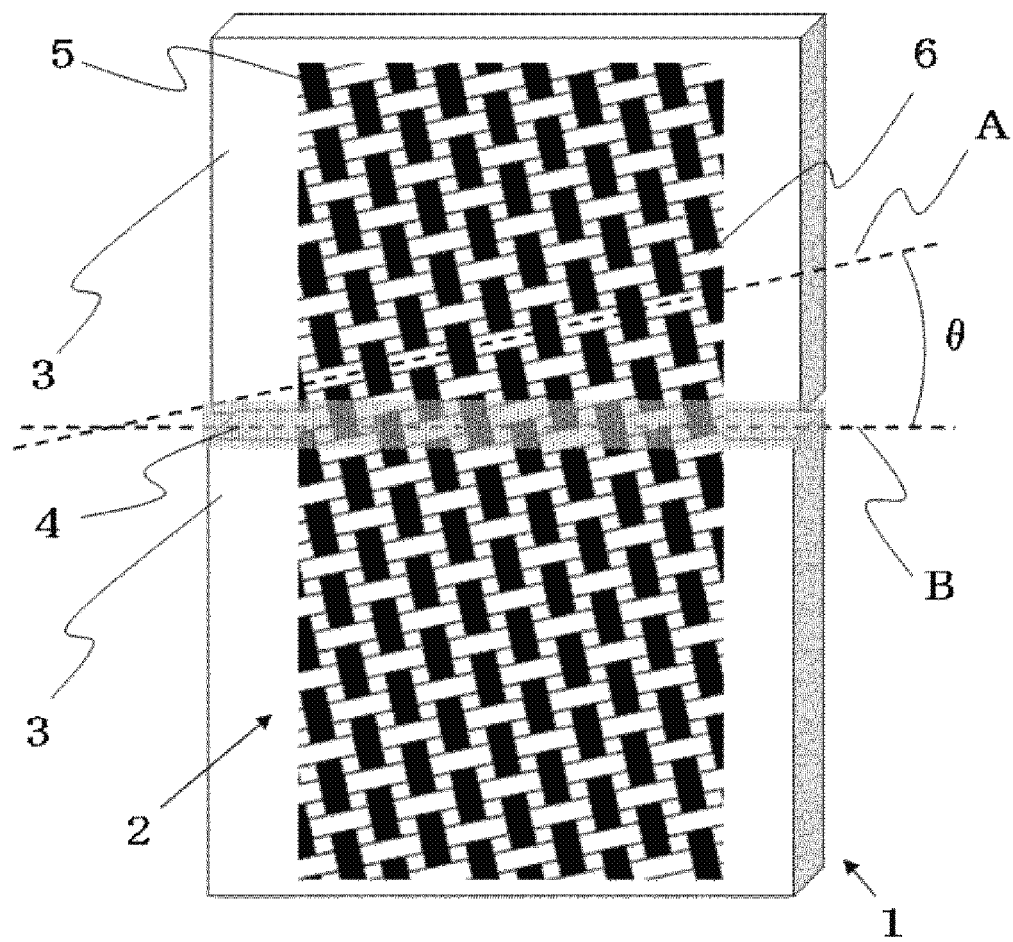

CONDUCTIVE MEMBER

TECHNICAL FIELD

The present disclosure relates to conductive members. In particular, the present disclosure relates to a conductive member that includes a linear bend, is imparted with conductivity across the bend, and can maintain favorable conductivity even when repeatedly bent.

BACKGROUND ART

With reductions in the sizes of electronic instruments, reductions in the sizes and thicknesses of conductive members used in the electronic instruments have also been demanded. There have also been many instruments having foldable structures in notebook-sized personal computers, tablets, portable game machines, and the like. In such cases, conductive members corresponding to folded structures have been used; however, the maintenance of conductivity has been difficult when the conductive members have been repeatedly bent. In particular, reductions in the sizes and thicknesses of instruments have caused the maintenance of conductivity to be precluded with decreasing the bend radii of bends.

Flexible printed circuit boards (FPCs) have been conventionally used in instruments imparted with conductivity across bends. However, there has been a problem that the bending of the FPCs at an acute angle at a bend radius of 0.5 mm or less has caused the resin films of base materials to be ruptured.

Patent Literature 1 describes that an inhibition film that inhibits the curvature radius of a bend from decreasing is disposed on the inside of the bend of a flexible printed circuit board. In such a method, the thickness of the flexible printed circuit board is partly increased, thereby precluding reductions in the size and thickness of an instrument. Moreover, there is a problem that bending cases the periphery of a bend to become bulky because a bend radius is inhibited from decreasing.

CITATION LIST

Patent Literature

Patent Literature 1: Unexamined Japanese Patent Application Kokai Publication No. 2007-27221.

SUMMARY OF INVENTION

Technical Problem

The present disclosure provides a conductive member that includes a bend with a small bend radius and that is imparted with favorable conductivity achieving endurance against repeated bending.

Solution to Problem

There is provided a conductive member including a conductive fabric containing warp and weft as well as a support, including at least one linear bend, and imparted with conductivity across the linear bend, wherein an angle formed between the linear bend and one of the warp and the weft is 5 to 45° C.

The conductive fabric is desirably a conductive fabric obtained by layering a metal coating, formed by a wet plating method, on a fabric including a synthetic fiber.

The bend radius of the conductive fabric bent at the linear bend is desirably 0.5 mm or less.

Advantageous Effects of Invention

According to the present disclosure, there can be provided a conductive member that is imparted with favorable conductivity achieving endurance against repeated bending in a bend with a small bend radius.

BRIEF DESCRIPTION OF DRAWINGS

FIG. 1 is a schematic view illustrating a conductive member of the present disclosure.

DESCRIPTION OF EMBODIMENTS

A conductive member of the present disclosure includes a conductive fabric containing warp and weft as well as a support. Examples of the material of the support include metals, ceramics, resins, and papers, without particular limitation. The support may also be a composite in which plural materials are combined. At least one linear bend is disposed on the support. The linear bend may have a mechanical structure such as a hinge structure or may have a structure in which a flexible resin material is partly used.

Examples of the conductive fabric used in the present disclosure include a conductive fabric obtained by forming a metal coating on a fabric including a natural fiber, a regenerated fiber, a semisynthetic fiber, a synthetic fiber, or the like. The metal coating is preferably formed using a technique such as a wet plating method (electroless plating or electroplating).

Examples of a metal included in the metal coating include copper, nickel, silver, gold, zinc, tin, and alloys thereof, and especially, copper, nickel, and silver are preferred in consideration of conductivity and a production cost. Such metal coatings formed of such metals may include only one layer or may have a multilayer structure including two or more layers.

Examples of the natural fiber include cotton, hemp, and silk, and examples of the regenerated fiber include rayon, cupra rayon, and polynosic rayon. Examples of the semisynthetic fiber include acetate fibers and protein-based semisynthetic fibers, and examples of the synthetic fiber include polyester fibers, polyamide fibers, acrylic fibers, vinylon fibers, polyolefin fibers, and polyurethane fibers. Especially, the synthetic fibers are preferred in view of strength, and in particular, the polyester fibers and the polyamide fibers are more preferred.

As the fabric forming the conductive fabric, a fabric is formed using warp and weft including the above-described fiber material. The finenesses of the warp and the weft are preferably 11 to 167 dtex, and more preferably 33 to 111 dtex. A fineness of 11 dtex or more results in excellent strength and in processability in a wet plating method. A fineness of 167 dtex or less, which prevents the texture of a fabric from becoming hard, is preferred. Examples of a weave of the fabric include plain weave, diagonal weave, and satin weave, without particular limitation, and the plain weave is preferred from the viewpoint of strength.

The conductive fabric is preferably a conductive fabric obtained by forming a metal coating, formed by a wet plating method, on a fabric including a synthetic fiber. The wet plating method enables the formation of the metal coating having a uniform, sufficient thickness. In addition, the wet plating method facilitates the formation of the metal coating not only on the whole of the fabric but also on part of the fabric, and enables free formation of a conductive pattern. The formation of the metal coating by the wet plating method may be performed after the formation of the fabric or may be performed in the state of yarn before weaving.

The metal coating formed by the wet plating method may be a coating having a single layer with a single metal or may be a coating obtained by layering coatings having plural layers with a single or plural kinds of metals. Examples of preferred combinations of metals include copper-nickel, copper-tin, and copper-silver. In the case of the single layer, electroless plating is applied as the wet plating method. In the case of layering the coatings having plural layers, the first metal coating is formed on a surface of the synthetic fiber by electroless plating. The second or subsequent layer coating may be a coating formed by electroless plating or may be a coating formed by electroplating in which the first coating formed by the electroless plating is used as a cathode.

The conductive fabric itself has higher flexibility than the flexibility of a flexible printed circuit board and has conductivity achieving high durability against repeated bending. However, the conductive fabric is fixed and arranged on the support so that an angle formed between yarn (warp or weft) and the linear bend disposed on the conductive member is 5 to 45° C., in a case in which attention is focused on any one of the warp and weft of the conductive fabric, in the conductive member of the present disclosure, in order to further improve bending resistance.

In the linear bend of the bent conductive member, the bend radius of the conductive fabric is preferably 0.5 mm or less. When the bend radius is 0.5 mm or less, durability in conductivity against the bending of the conductive member of the present disclosure becomes superior. In addition, the conductive member of the present disclosure is more compactly folded, and thus the bend radius is desirable.

A coating with a resin is preferably formed on a surface of the conductive fabric on which the metal coating is formed. Examples of the resin that forms the coating include acrylic resin, urethane resin, melamine resin, epoxy resin, polyester resin, polyamine resin, vinyl ester resin, phenolic resin, fluorine resin, and silicon resin, and urethane resin is particularly preferred from the viewpoint of flexibility.

A known technology such as coating, lamination, impregnation, or dip lamination can be used as a method of forming the coating with a resin. Knife coating is most preferred from the viewpoint of the easiness of adjustment of the amount of coated resin and reduction in influence at the time of contamination of a foreign substance (protrusion).

EXAMPLES

Bending Test Method: A bending test was conducted using an MIT type folding endurance tester (manufactured by Toyo Seiki Seisaku-sho, Ltd.) under the following conditions. Angles formed between a bend and the weft of a conductive fabric were set at 0°, 5°, 10°, 30°, and 45°.
Cycle: 20000 times
Bend radius: 0.38 mm
Bending rate: 175 cpm
Bending angle: ±135°.
Load: 0 kg
Size of test piece: 130 mm×15 mm For evaluation of conductivity, a test piece is pinched by the clip type probe of Milliohm HiTESTER (manufactured by HIOKI E.E. CORPORATION) at a position across a bend, and a resistance value is measured. For measurement of a resistance value after the bending test, resistance values are measured while bending the bend toward both sides 20 times, and the maximum resistance value is read. An increasing rate of a resistance value after the bending test with respect to a resistance value before the bending test was calculated and evaluated by the following method.

$$(\text{Increasing rate of resistance value }(\%))=\{(\text{resistance value after bending test }(\Omega))/(\text{resistance value before bending test }(\Omega))\}\times 100$$

Test Example 1

Warp: polyester processed yarn (33 dtex)
Weft: polyester processed yarn (69 dtex)
Plain weave (warp weaving density: 189 yarns/2.54 cm, weft weaving density: 120 yarns/2.54 cm)

A metal coating was formed under the following conditions.

The fabric described above was dipped in an aqueous solution containing 0.3 g/L of palladium chloride, 30 g/L of stannous chloride, and 300 ml/L of 36% hydrochloric acid at ordinary temperature for 30 seconds, and then sufficiently washed with water (catalytic application). Then, the fabric was dipped in fluoroboric acid having an acid concentration of 0.1 N at 40° C. for 1 minute, and then sufficiently washed with water (catalytic activation). Subsequently, the fabric was dipped in a solution containing 9 g/L of cupric chloride, 9 ml/L of 37% formalin, 40 ml/L of 32% sodium hydroxide, 20 g/L of N,N,N',N'-tetrakis(2-hydroxypropyl)ethylenediamine, and a stabilizer at 40° C. for 15 minutes, thereby uniformly forming a copper coating at 30 g/m$^2$ on the fabric, and in addition, the fabric was sufficiently washed with water (electroless copper plating). Further subsequently, the fabric was dipped in a solution containing 70 g/L of nickel sulfate, 30 g/L of trisodium citrate, and an antiseptic agent, and subjected to electroplating at a current density of 2 A/dm$^2$ at ordinary temperature for 1 minute using the copper coating as a cathode and a soluble nickel plate as an anode. As a result, a nickel coating was formed at 5 g/m$^2$ on the copper coating, and in addition, the fabric was sufficiently washed with water (electric nickel plating). Finally, the fabric was dried to obtain a conductive fabric on which a silver-gray metal coating having a copper-nickel, two-layer structure was formed.

Subsequently, a coating was formed by a knife coating method. Coating conditions are as follows. A resin solution obtained by mixing 100 parts by weight of aqueous polyurethane resin (HYDRAN WLS-202, manufactured by DIC Corporation) and 3 parts by weight of thickener (SENKA ACTGEL NS100, manufactured by SENKA Corporation) was applied at 5 g/m$^2$ on a solid content basis onto a front surface of the fabric by a knife coating method, and was dried at 120° C. for 1 minute. Like the front surface, a coating was also formed on the back surface of the fabric by coating and drying.

Test Example 2

Test Example 2 was the same as Test Example 1 except that the formation of a coating with a resin was not performed.

Test Example 3

Test Example 3 was the same as Test Example 2 except that a plated metal was formed only by electroless copper plating.

Test Example 4

Test Example 4 was the same as Test Example 1 except that electric nickel plating on the copper coating was changed to electric silver plating. The conditions of the electric silver plating are as follows. A fabric on which a copper coating was formed was dipped in an aqueous solution containing DAIN SILVER ACC (manufactured by Daiwa Fine Chemicals Co., Ltd.) at ordinary temperature for 30 seconds, and was then sufficiently washed with water (acid washing). The fabric was dipped in DAIN SILVER GPE-ST15 (manufactured by Daiwa Fine Chemicals Co., Ltd.), subjected to electroplating using the copper coating as a cathode and an insoluble anode at a current density of 2 $A/dm^2$ at ordinary temperature for 1.5 minutes, and sufficiently washed with water. As a result, a silver coating was uniformly formed at 5 $g/m^2$ on the copper coating (electric silver plating). Subsequently, the fabric was dipped in an aqueous solution containing DAIN SILVER ACC (manufactured by Daiwa Fine Chemicals Co., Ltd.) at ordinary temperature for 30 seconds, and then sufficiently washed with water (acid washing). In addition, the fabric was dipped in an aqueous solution containing NEW DAIN SILVER S1 (manufactured by Daiwa Fine Chemicals Co., Ltd.) at 40° C. for 1 minute, and then sufficiently washed with water (discoloration prevention treatment). Finally, the fabric was dried to obtain a conductive fabric on which a white metal coating having a copper-silver, two-layer structure was formed.

Test Example 5

Test Example 5 was the same as Test Example 1 except that the fabric was changed to the following fabric.
Warp: polyester raw yarn (55 dtex)
Weft: polyester raw yarn (33 dtex)
Plain weave (warp weaving density: 152 yarns/2.54 cm, weft weaving density: 130 yarns/2.54 cm)

Test Example 6

Test Example 6 was the same as Test Example 1 except that the fabric was changed to the following fabric.
Warp: polyester raw yarn (55 dtex)
Weft: polyester processed yarn (55 dtex)
Plain weave (warp weaving density: 152 yarns/2.54 cm, weft weaving density: 120 yarns/2.54 cm)

The results of conducting a bending test with the use of the conductive fabric obtained in each of the Test Examples described above and evaluating conductivity are shown in Table 1.

TABLE 1

| Angle formed between weft and bend (°) | Increasing rate of resistance value (%) | | | | | |
| --- | --- | --- | --- | --- | --- | --- |
| | Test Example 1 | Test Example 2 | Test Example 3 | Test Example 4 | Test Example 5 | Test Example 6 |
| 0 | 2124 | 147312 | 27943 | 2240 | 219048 | 217778 |
| 5 | 255 | 970 | 870 | 440 | 361 | 912 |
| 10 | 180 | 252 | 294 | 281 | 260 | 159 |
| 30 | 148 | 157 | 134 | 194 | 205 | 138 |
| 45 | 127 | 204 | 129 | 196 | 263 | 224 |

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2015-182825, filed on Sep. 16, 2015, the entire disclosure of which is incorporated by reference herein.

REFERENCE SIGNS LIST

1 Conductive member
2 Conductive fabric
3 Support
4 Linear bend
5 Warp
6 Weft
A Auxiliary line indicating direction of weft
B Auxiliary line indicating direction of linear bend
θ Angle formed between linear bend and weft (warp)

The invention claimed is:

1. A conductive member comprising a conductive fabric containing warp and weft as well as a support, comprising at least one linear bend, and imparted with electrical conductivity across the linear bend, wherein
an angle formed between the linear bend and one of the warp and the weft is 5 to 45°;
at least one of the warp or the weft has a fineness of 11 dtex or more and less than 55 dtex; and
a bend radius of the conductive fabric bent at the linear bend is 0.5 mm or less.

2. The conductive member according to claim 1, wherein the conductive fabric is a conductive fabric obtained by layering a metal coating, formed by a wet plating method, on a fabric comprising a synthetic fiber.

3. The conductive member according to claim 1, wherein the bend radius of the conductive fabric bent at the linear bend is 0.38 mm.

4. The conductive member according to claim 1, wherein the angle formed between the linear bend and the one of the warp and the weft is 10° or more and less than 30°.

5. The conductive member according to claim 1, wherein an increasing rate of resistance value after a bending test using an MIT type folding endurance tester under a condition having 20000 cycles and a bend radius of 0.38 mm is less than 1000%.

* * * * *